United States Patent [19]

Baldi

[11] Patent Number: 5,761,222
[45] Date of Patent: Jun. 2, 1998

[54] MEMORY DEVICE HAVING ERROR DETECTION AND CORRECTION FUNCTION, AND METHODS FOR READING, WRITING AND ERASING THE MEMORY DEVICE

[75] Inventor: Livio Baldi, Agrate Brianza, Italy

[73] Assignee: SGS-Thomson Microelectronics, S.r.l., Milan, Italy

[21] Appl. No.: 538,161

[22] Filed: Oct. 2, 1995

[30] Foreign Application Priority Data

Sep. 30, 1994 [EP] European Pat. Off. ............ 94830471

[51] Int. Cl.$^6$ .................................................. G11C 16/06
[52] U.S. Cl. ................................................... 371/40.18
[58] Field of Search ........................... 371/40.1, 40.2, 371/40.18; 395/182.04, 182.05, 182.06; 365/200

[56] References Cited

U.S. PATENT DOCUMENTS

| | | | |
|---|---|---|---|
| 4,058,851 | 11/1977 | Scheuneman | 395/182.04 |
| 4,249,253 | 2/1981 | Gentili et al. | 371/40.3 |
| 4,654,847 | 3/1987 | Dutton | 395/182.04 |

FOREIGN PATENT DOCUMENTS

| | | |
|---|---|---|
| 0485976 | 1/1982 | European Pat. Off. . |
| 0042966 | 5/1992 | European Pat. Off. . |

*Primary Examiner*—Steophen M. Baker
*Attorney, Agent, or Firm*—Robert Groover; Betty Formby; Matthew Anderson

[57] ABSTRACT

The present invention relates to a memory device and specifically the multilevel type with error check and correction function and having a data input (DI), a data output (DO) and an address input (AI) and being of the type comprising first memory, circuit (DM) designed to be accessed by means of address for containing user data, second memory circuit (EM) for containing error data concerning said user data, a control logic (CL) designed to receive in the writing phase from said address input (A1) and the data input (DI) a writing address and user data respectively and to generate error data and to write, the data in the first circuit (DM) and second circuit (EM) respectively and designed to receive in the reading phase from said address input (AI) a reading address and extract corresponding user data and error data and combine them to correct any errors and supply them to the data output (DO) and characterized in that the second, circuit (EM) is the type designed to be accessed by means of content and, the content for access corresponding to addresses of said first circuit (DM).

31 Claims, 3 Drawing Sheets

MEMORY DEVICE HAVING ERROR DETECTION AND CORRECTION FUNCTION, AND METHODS FOR READING, WRITING AND ERASING THE MEMORY DEVICE

CROSS-REFERENCE TO RELATED APPLICATION

This application claims priority from EPC App'n 94830471.2, filed Sep. 30, 1994, which is hereby incorporated by reference. However, the content of the present application is not necessarily identical to that of the priority application.

BACKGROUND AND SUMMARY OF THE INVENTION

The present invention relates to multilevel floating-gate integrated circuit memories, in which multiple bits of data are stored on the gate of each cell, and particularly to methods and structures for error detection and correction in such memories.

The problem of error correction in conventional memories has been faced in the past. For example, U.S. Pat. No. 4,958,352 proposes a semiconductor memory device equipped with an Error Check and Correction Circuit (ECC) comprising a first cell matrix for the actual data and a second cell matrix for the error check and correction data. With every data word, 8 bits in the example, is associated an error check and correction word, 4 bits in the example, permitting identification and correction of a single error, which is usually sufficient. Every binary datum is memorized in a different memory cell.

The reading and writing operations are controlled and coordinated by a complex circuitry (also comprising the error check and correction circuit) which can be described as a control logic which, in the writing phase, is designed to receive a writing address and user data, generate error data and write said data in the first and second matrix respectively and, in the reading phase, is designed to receive a reading address, extract corresponding user data and error data from the first and second matrices respectively, combine them to correct any errors, and supply them at output.

The solution proposed by said patent involves for good efficiency of the device the employment of a considerable number of memory cells; in the example 33% of the cells of the device are dedicated to error identification and correction. If errors are rare said employment is not justified.

A particular type of phenomena which originates rare steady and/or intermittent errors occurs in EEPROM and flash EPROM memories written and/or erased by means of Fowler-Nordheim tunnelling. Said "writing" mechanism (this term is used in a broad sense in the present document) exhibits in addition to a normal dispersion a queue of a few cells having much higher writing speeds and furthermore there may be present "erratic bits", i.e. cells which from a certain point onward exhibit for a certain variable time interval a much higher writing speed.

It was sought to obviate this problem a priori by using special writing strategies (many very fine programming steps) such as to adapt to the different writing speeds of the various cells, or using a priori normal writing strategies and recovering a posteriori the "overwritten" or "overerased" cells by means of the same special writing strategies.

This problem is much more severe for multilevel memories where cell characteristics dispersion must of course be limited.

The purpose of the present invention is to supply a memory device and in particular the multilevel type capable of identifying and correcting any errors and not exhibiting the shortcomings of the known art.

In case of error, a content-addressable memory is used to store the addresses of the erroneous data. In this way, the number of cells dedicated to error check and correction proves to be rather small.

Since the error data are written only in case of error this does not substantially affect the average time for writing the user data to memory. In addition, even if there is an error, part of the error data memorization operations can be executed in parallel with the user data memorization operations and the additional time required is thus reduced. Furthermore, since the error data memorization operations can be provided independently by the user information memorization operations, the remaining part of the operations not yet executed can be executed in parallel next considering that it is highly improbable that errors will occur in two consecutive writing operations.

In the case of EEPROM and flash EPROM memories there can be used, thanks to the present invention, normal writing strategies while leaving recovery of the writing errors to the error data.

BRIEF DESCRIPTION OF THE DRAWING

The disclosed inventions will be described with reference to the accompanying drawings, which show important sample embodiments of the invention and which are incorporated in the specification hereof by reference, wherein.

The present invention is clarified by the following description of some embodiments considered together with the annexed drawings wherein.

DETAILED DESCRIPTION OF THE PREFERRED EMBODIMENTS

Figure 1:
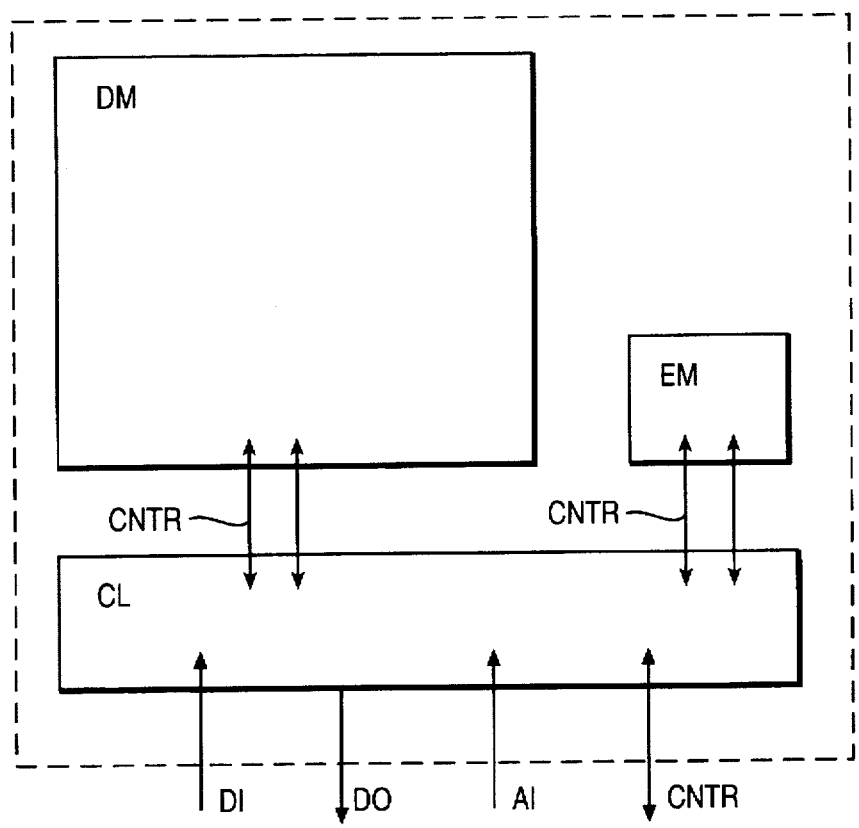
FIG. 1 shows a block diagram of the memory device in accordance with the present invention.

Multi-level storage is performed by allowing four or more signal levels to be stored in a floating-gate memory cell. The use of multiple possible levels of stored charge permits two or more bits of data to be stored on each cell; this increases the capacity of the memory for a given technology. This technique can be applied in EEPROMs or in flash memories. This disclosure refers in particular to a memory which is programmed using Fowler-Nordheim tunnelling.

One of the principal problems in multi-level storage consists in maintaining the correct level of the signal. Use of a sequence of steps for writing and verification (as is common for conventional 2-level devices) could be used if the speed of writing of individual cells is similar: in this case, a limited number of cycles suffices to adjust the cells to the desired intervals. In particular, a sequence of "coarse" cycles can be used for an overall adjustment, followed by "fine" cycles for adjustment.

However, the Fowler-Nordheim writing mechanism presents, besides the normal dispersion in the statistical distribution, a tail component of a few cells which have a much faster speed of writing. Moreover, there may be "erratic bits" present, which, from a certain point onward, present a highly elevated write speed, after an unknown number of cycles. While a few cells may have anomalous programmation speed from the beginning (and can therefore be eliminated with redundancy), a problem remains for the cells which change their behavior during the operating lifetime.

A first solution consists in a sequence of very fine programmation steps, chosen to accommodate the fastest cells, but this implies an unacceptable time for programmation.

A second solution consists in implementing error correction codes (or error check and correction codes), which use additional cells to store supplemental data which permits correction (or detection and correction) of an incorrect bit. However, in any case, in the case of byte-wide writing, this technique requires the use of a large quantity of additional cells (4 for each 8-bit byte). The resultant area consumption eliminates the advantages of multilevel programming, merely to correct a very few incorrect bits (of the order of one in a few thousand).

The disclosed innovative memory attackes the noted problems by partial use of error correction (or detection and correction) codes. A supplemental array is used for correction or ECC data. The supplemental array is much smaller than the memory array, and is structured as a CAM (content-addressable) memory. This system functions as follows.

The programmation mechanism is adjusted for the normal distribution of write speed in the cells, with a limited number of cycles for write and verify (three or four times the desired number of levels).

Before writing, error correction codes are generated, which are stored in an SRAM block.

At the end of programmation, or when the maximum number of cycles is exceeded, the contents of the memory are read out and compared with the desired contents.

If anomalous fast bits are present, the desired contents will not be present, since a cell which exceeds the desired level cannot be recovered except by erasing the block and starting over.

In this case the error correction code is stored together with the address of the cell in a dedicated array portion, using normal two-level programmation, to avoid problems of erratic bits.

During the read phase, the correction matrix is read together with the array. If the address of an accessed cell is present in the correction matrix, the error correction code is combined with the contents of the byte, to reconstruct the correct data.

In this system the anomalous bits can be corrected at little added cost, even if they appear randomly during the operating life of the memory (as long as they are only a small part of the array).

Among the improvements is the possibility of erasing the address of a cell which has failed once whenever a subsequent write operation detects that there is no problem.

The store on the correction matrix can be performed in parallel with the normal operation of the memory and does not produce delay. Moreover, the codes can be generated on the basis of the comparison between the stored data and the input data, and also the address of the defect, and hence can be very efficient.

An alternative is to store in the correction matrix merely the correct value, using normal two-level storage: when the address sought is present in the correction matrix, the value stored there is substituted at the output for the memory's value.

Another alternative is to generate the ECC codes only after having verified that the written content is in fact erroneous (this is possible since the data is still available in the buffer SRAM.

For example, in a 16M memory, organized in 8-bit bytes, 22 bits would be necessary for the address, and 4 to 8 bits of correction per byte. Assuming that the incidence of errors to be corrected is on the order of one in 1,000 (since otherwise the technology would not be acceptable) and that a multi-level storage technique provides four levels (two bits) per cell, the quantity of correction memory required corresponds in the worst case, to 30 cells in 4,000, i.e. to an increase in area of less than 1%.

The numerous innovative teachings of the present application will be described with particular reference to the presently preferred embodiment (by way of example, and not of limitation), in which:

With reference to FIG. 1 the memory device in accordance with the present invention has an error check and correction function and possesses a data input DI, a data output DO and an address input AI and in addition there are of course the usual control signals CNTR received at input and generated at output and which are exchanged between the various circuit blocks included in the device.

It includes:

a) first memory means DM designed to be acceded to by means of address for containing user data;

b) second memory means EM for containing error data related to the user data and of a type designed to be acceded to by means of content and such content for access corresponding to addresses of the first memory means DM;

c) a control logic CL designed to receive in the writing phase from the address input A1 and the data input DI a writing address and user data respectively, generate error data and write such data in the first and second memory means respectively, and designed to receive in the reading phase from the address input A1 a reading address, extract corresponding user data and error data, and combine them to correct any errors and supply them to the data output DO.

The error data contained in the memory means EM can be of various kinds corresponding to the user data themselves, to data designed to identify and correct possible errors in the user data, or data designed to correct specific errors occurring in the writing of the user data.

Figure 2:
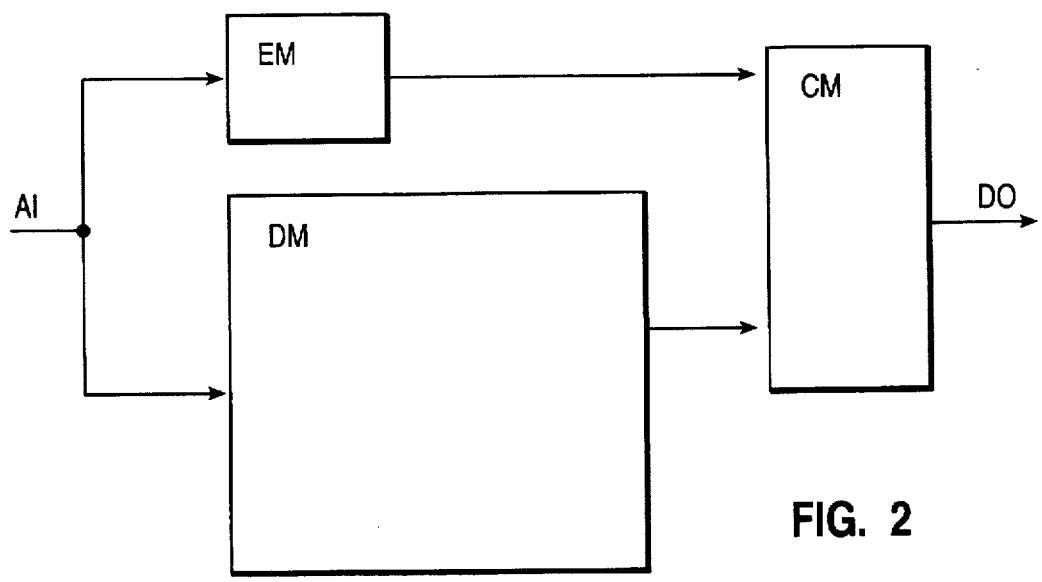
FIG. 2 shows a possible diagram in greater detail of the device of FIG. 1 limited to the blocks affected by a reading operation.

FIG. 2 shows a possible diagram in greater detail of the device of FIG. 1 limited to the blocks affected by a writing operation.

The address input A1 of the device is connected to the address input of the memory means DM and the input of access to the memory means EM. The data outputs of the means DM and EM are connected to the error connection means inputs CM designed to combine the input signals. The output of the means CM is connected to the data output DO of the device.

Depending on the type of error data contained in the memory means EM said means CM said means CM can consist of simple switches, means designed to identify and correct on the basis of the error data at the input, any errors in the user data, or in means designed to correct on the basis of the error data at the input specific errors occurring in the previous writing of the user data.

Naturally the means CM must provide said operations only if error data associated with the address concerned are found in the memory means EM. This can be achieved e.g. by having the means EM generate a control signal indicating to the means CM the presence or not of the error data or, if error data is missing, having the combination of the input data with the means CM give as a result the unchanged user data. A mathematical example could be: the sum of "zero" with any number gives the same number.

Four different possible detailed block diagrams of the device of FIG. 1 limited to the blocks affected by the writing operation are discussed below.

Figure 3:
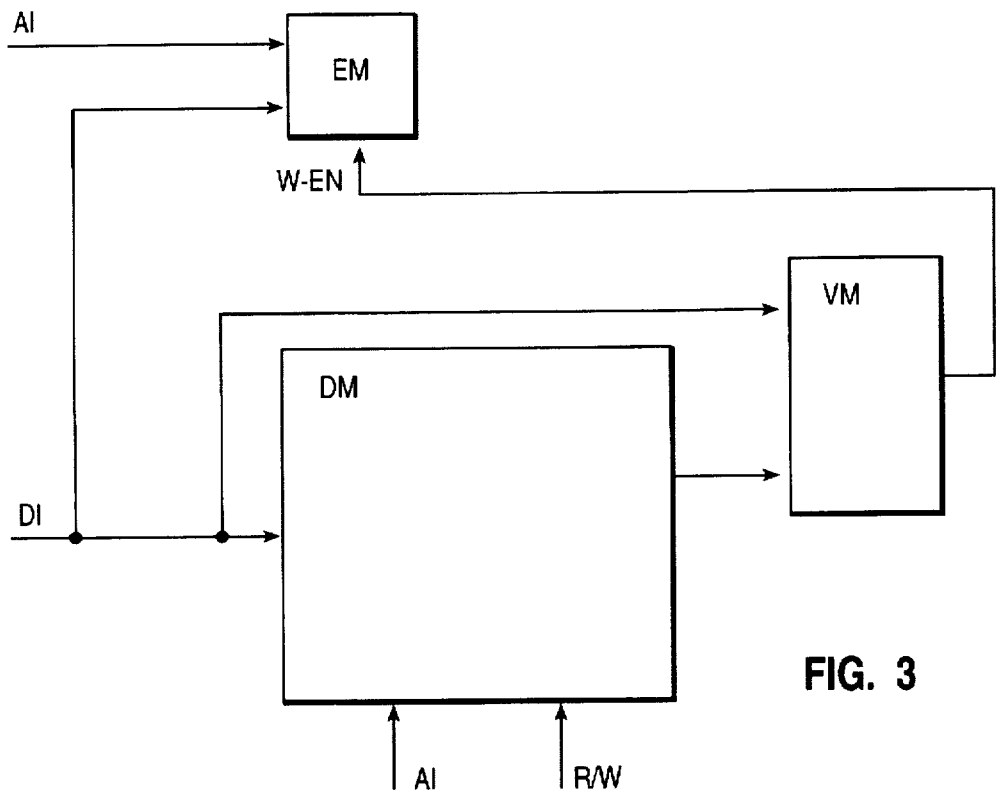
FIG. 3 shows a first possible diagram in greater detail of the device of FIG. 1 limited to the blocks affected by a writing operation.

With reference to FIG. 3 the first diagram represents the first memory means DM and the second memory means EM. Both are connected to the address input A1 and the data input DI and furthermore the former exhibit a read/write control input R/W and the latter a writing enablement signal W-EN. The data input DI and the output of the means DM are connected to the inputs of the check means VM which are designed to generate in the writing phase a check signal corresponding to the comparison between the data at their input. Said check signal is sent to the input W-EN of the means EM.

With this architecture the writing of the error data in the means EM takes place only if an error has occurred in writing the user data in the memory means DM. In the example of FIG. 3 the user data are memorized in the means EM after the finding of an error. Alternatively the user data can be memorized simultaneously in the means DM and EM and if no error is found the error data are erased from the means EM. The check signal is however to be sent to an erasure control input, not shown in FIG. 3, of the means EM.

Figure 4:
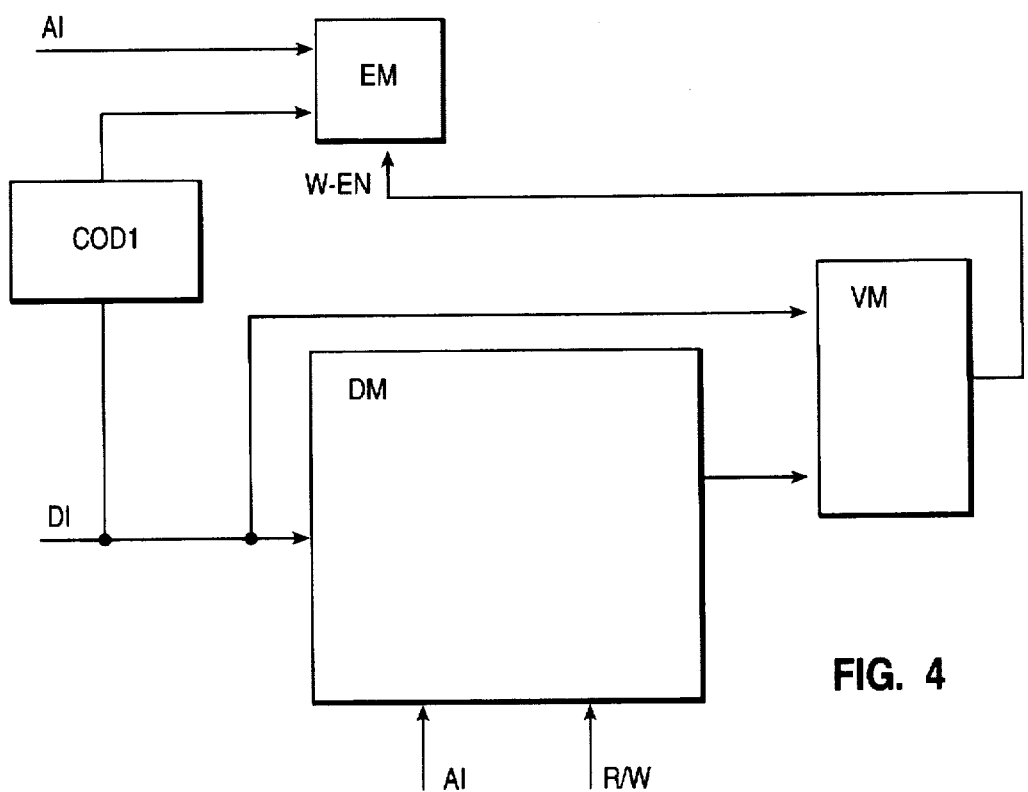
FIG. 4 shows a second possible diagram in greater detail of the device of FIG. 1 limited to the blocks affected by a writing operation.

With reference to FIG. 4, the second diagram is the same as the former except that the data input DI is connected to the means EM not directly but through a first coder COD1. Said coder is capable of generating error data in such a manner that they correspond to the coding of the user data by means of an algorithm capable of identifying and correcting a predetermined number of errors.

For a good discussion of said code and algorithm types reference can be had to the book by Jiri Adamek, "FOUNDATIONS OF CODING", John Wiley & Sons (1991), which is hereby incorporated by reference.

Even for this diagram the same remarks made for the diagram of FIG. 3 apply. Furthermore the check signal can also be sent to an operational enablement input, not shown in FIG. 4, of the coder COD1. In this manner generation of the error data takes place only in case of a writing error.

Figure 5:
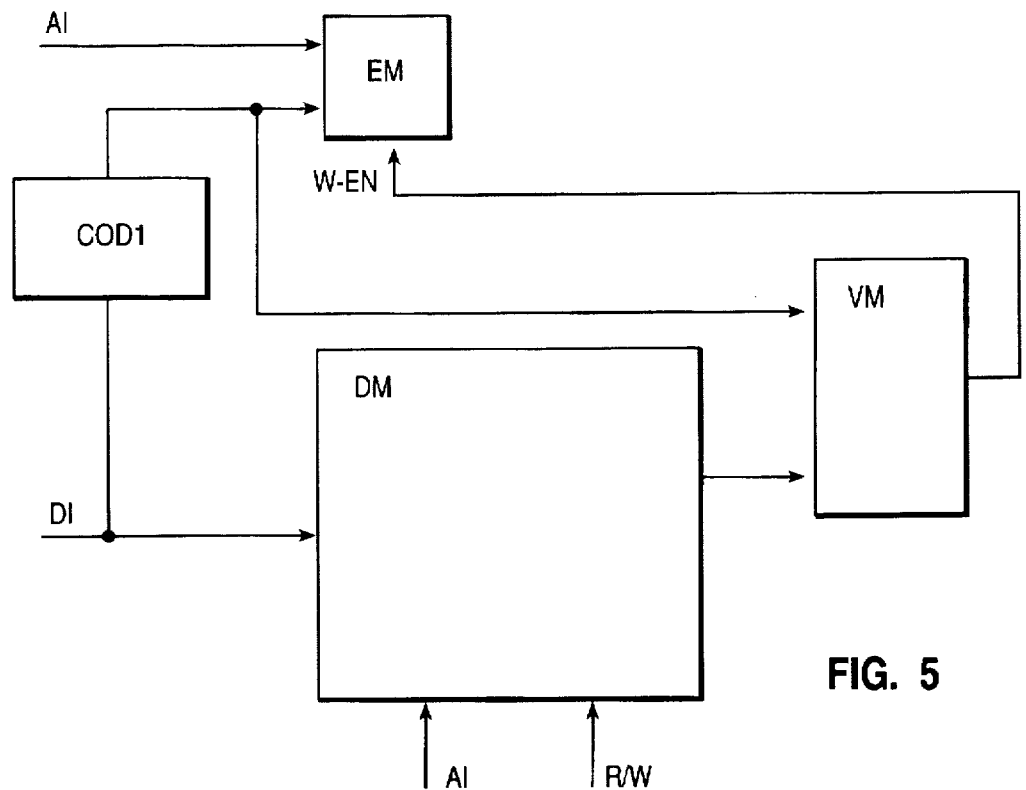
FIG. 5 shows a third possible diagram in greater detail of the device of FIG. 1 limited to the blocks affected by a writing operation.

With reference to FIG. 5 the third diagram is identical to the second except that one of the inputs of the check means VM is connected to the output of the coder COD1 instead of to the data input DI. In this case generation of the error data takes place independently of any writing errors. The check means will comprise a more complex circuitry than that necessary in the above diagrams and indeed they must be so in order to identify the presence of data errors at the output of the means DM by using an algorithm corresponding to that used in the coder COD1.

Figure 6:
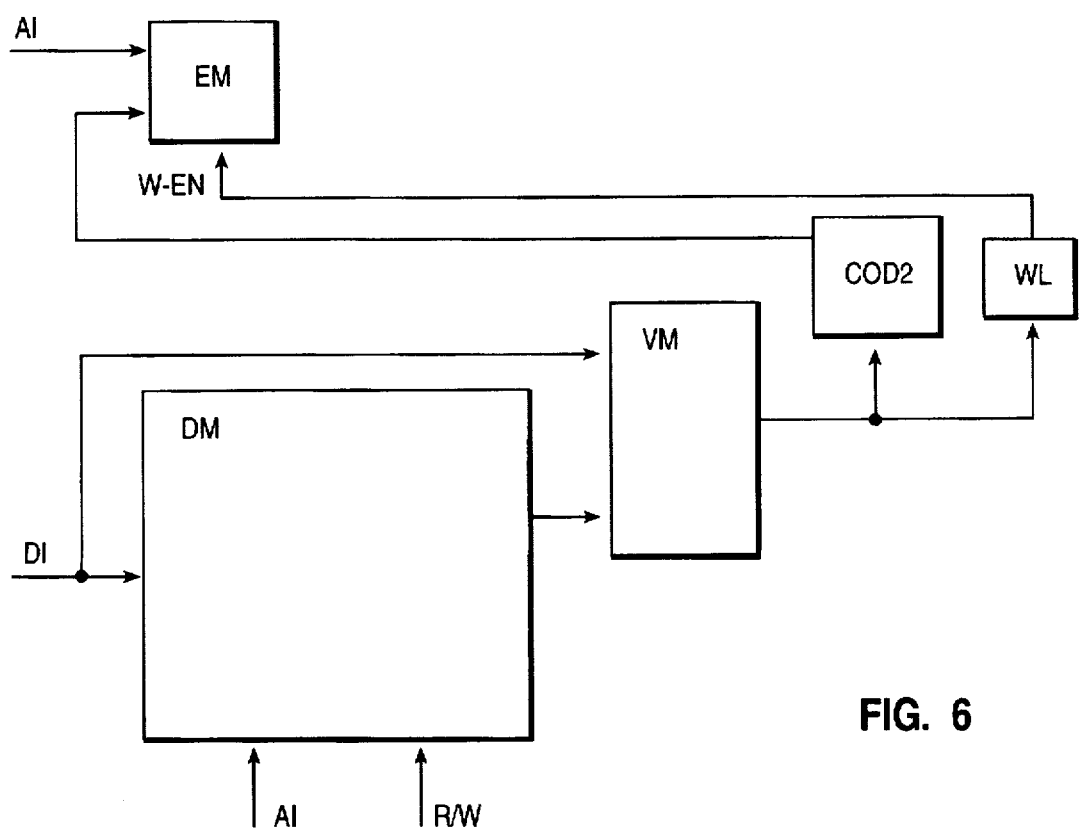
FIG. 6 shows a fourth possible diagram in greater detail of the device of FIG. 1 limited to the blocks affected by a writing operation.

With reference to FIG. 6 the fourth diagram is a bit different from those discussed above. It represents the first memory means DM and the second memory means EM. Both are connected to the address input A1 while only the former are connected to the data input DI and in addition the former exhibit an input R/W for read/write control and the latter a writing enablement signal W-EN and a data input. The data input DI and the output of the means DM are connected to the inputs of check means VM which are designed to generate in the writing phase a check signal corresponding to the comparison between the data at their input. More specifically the check signal consists in this case of a difference signal, which is sent to a second coder COD2, and an outcome signal which is sent to a writing logic WL. The output of the coder COD2 is sent to the data input of the means EM while the output of the writing logic WL is sent to the input W-EN of the means EM.

The difference signal corresponds to the difference between the digital data making up the signals supplied to the inputs of the means VM. The outcome signal corresponds to the outcome of the comparison identity/non-identity between said digital data. The coder COD2 is then suitable to generate the error data in such a manner that they correspond to the coding of said difference.

As mentioned above, the present invention finds advantageous employment for multilevel memories. In this case the memory means EM can be the multilevel type like the means DM or they can be the two-level type to ensure greater reliability.

Further advantages are achieved if the first and second memory means consist of two semiconductor memory cell matrices and specifically the EEPROM or flash EPROM type.

It is natural that even the memory means EM are subject to errors which can exist right from production or can appear during normal operation. In many cases said errors can be accepted given the small size of said means and hence the limited effect on productivity or on failures during operation. If this is not acceptable for any reason it can be thought to provide redundancy for memory means EM or apply thereto known error correction means or error correction means in accordance with the present invention.

To be able to use such a type of memory device it is necessary to use reading, writing and erasure methods specifically adapted thereto.

The method in accordance with the present invention for reading user data corrected by a memory device of the type comprising first memory means DM for containing user data designed to be accessed by means of address and second memory means EM for containing error data concerning the user data and designed to be accessed by means of content comprises the following phases:

a) send to said device a reading address corresponding to the user data to be read, b) access by means of the reading address to user data addressed in the memory means DM, c) access by means of the content of the reading address to possible error data in the memory means EM, and d) combine the addressed user data and any error data to obtain the corrected user data.

If there are no error data corresponding to said reading address the corrected data correspond to the addressed data and phase d) has no effect.

One method in accordance with the present invention for writing corrected user data in a memory device of the type comprising first memory means DM for containing user data designed to be accessed by means of address and second memory means EM for containing error data concerning the user data designed to be accessed by means of content comprises the following phases:

7 a) send to said device a writing address,
b) send to said device user data to be memorized,
c) write the user data to be memorized in the memory means DM in a position corresponding to the writing address,
d) access by means of the writing address to user data addressed in the memory means DM,
e) check the identity of the user data to be memorized and of the addressed user data and in case of failure of said check:
f) generate error data capable of correcting errors in the addressed user data, and
g) write the error data generated in the memory means EM and associate them with the writing address for access.

An advantageous choice for its simplicity, the error data generated correspond to the user data to be memorized, hence phase f) has no effect.

It may be important, in particular in the case of intermittent errors, to be able to reuse the memory cells of the means EM when they are no longer used for memorizing error data associated with a certain address of the means DM. This occurs when the cells of the means DM corresponding to said certain address have first originated writing errors and subsequently resumed correct operation.

The solution to this problem may be that, if the identity check does not fail, any error data associated with the writing address are erased from the means EM. Erasure will thus take place really only in the case of rewriting of cells which had previously originated writing errors.

This erasure could take place, in a quite simple manner, e.g. by marking the error data as "erased" instead of erasing them physically.

A second writing method in accordance with the present invention and an alternative to that discussed above but identical thereto in its essential part could be used if it is preferred to parallelize the operations of writing the user data in the means DM and of error data in the means EM.

This comprises the following phases:

a) send to said device a writing address,
b) send to said device user data to be memorized,
c) write the user data to be memorized in the means DM in a position corresponding to the writing address,
d) access by means of the writing address to user data addressed in the means DM,
e) generate error data capable of correcting errors in the addressed user data,
f) write the error data in the means EM and associate them with the writing address for access,
g) check the identity of the user data to be memorized and of the addressed user data, and
h) if the check is successful, erase from the means EM the error data associated with the writing address.

The two writing methods discussed refer to generic user data. As mentioned above, taking the term "write" in a broad sense, said methods can also be termed erasure methods when the erasure operation is thought of as the writing of a predetermined datum which is the same for all the cells or words.

Based on this consideration said methods could be used also to overcome the problem of 'bit depletion' during erasure of the flash EPROM memories. Indeed, if after a normal total erasure of a device or of a sector of such a memory it is seen that few cells, for any reason, are not erased (i.e. do not contain the desired data) instead of continuing the total erasure of the memory, by applying the present methods error data are generated and written in the means EM. In this manner the possible erasure of the other cells is prevented.

Often however the erasure operation refers to the mere marking of the 'erased' cell.

The method in accordance with the present invention of erasing (in the most common sense of the term) user data in a memory device of the type comprising first memory means DM for containing user data designed to be accessed by means of address and second memory means EM for containing error data concerning the user data designed to be accessed by means of content comprises the following phases:

a) send to said device an erasure address,
b) erase from the means DM user data in a position corresponding to the erasure address, and
c) erase from the means EM any associated error data for access to the erasure address.

Not all the devices in general have the erasure function and more often the memory cells are rewritten. In this case the procedure for reuse of the cells of the memory EM is discussed above.

According to a disclosed class of innovative embodiments, there is provided: An integrated circuit memory, comprising: a first array of memory cells arranged in rows and columns, wherein each individual one of said cells, at the intersection of a single row and a single column, stores more than one bit of data; a second array of memory cells storing data which includes multiple address-match identifiers, said second array being content-addressable and less than half the size of said first array; and circuitry which provides an output, when access to a read address is requested, as follows: if read access is requested to an address which is not stored in the address-match field of any cell in said second array, then said output circuitry reads out data from said first array, without any read access to said second array; and if read access is requested to an address which is stored in the address-match field of one of said cells in said second array, then said output circuitry reads out data which is at least partially determined by the contents of said second array.

According to another disclosed class of innovative embodiments, there is provided: An integrated circuit memory, comprising: a first array of floating-gate memory cells arranged in rows and columns, wherein each individual one of said cells consists only of a single transistor, and stores more than one bit of data; a second array of memory cells storing data which includes multiple address-match identifiers, said second array being less than half the size of said first array; and wherein said second array, but not said first array, is content-addressable; and circuitry which provides an output, when access to a read address is requested, as follows: if read access is requested to an address which is not stored in the address-match field of any cell in said second array, then said circuitry reads out data from said first array with multiple bits of precision, without any read access to said second array; and if read access is requested to an address which matches the address-match field of one of said cells in said second array, then said output circuitry reads out data which is at least partially determined by the contents of said second array.

According to another disclosed class of innovative embodiments, there is provided: An integrated circuit memory, comprising: a first array of memory cells; a second array of memory cells storing data which includes multiple address-match identifiers, said second array being content-addressable and less than half the size of said first array; and circuitry which provides an output, when access to a read address is requested, as follows: if the read address does not match any of said address-match identifiers in said second array, then said circuitry reads out data from said first array with multiple bits of precision from each cell, and does not output data from said second array; and if the read address does not match any of said address-match identifiers in said second array, then said circuitry outputs data which is at least partially determined by the contents of said second array.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

For another example, the transistors of the error array do not strictly have to have the same dimensions or device parameters as those of the primary array.

For another example, although the disclosed innovations are particularly advantageous in the context of floating-gate memories, they can also be adapted to other memory technologies in which multi-level storage can be used. Such technologies may include e.g. other trapped-charge technologies (such as MNOS), or may include other technologies such as ferroelectric RAM.

What is claimed is:

1. An integrated circuit memory, comprising:
   a first array of memory cells arranged in rows and columns, wherein each individual one of said cells, at the intersection of a single row and a single column, stores more than one bit of data;
   a second array of memory cells storing data which includes multiple address-match identifiers, said second array being content-addressable and less than half the size of said first array;
   and circuitry which provides an output, when access to a read address is requested, as follows:
     if read access is requested to an address which is not stored in the address-match field of any cell in said second array, then said output circuitry reads out data from said first array, without any read access to said second array; and
     if read access is requested to an address which is stored in the address-match field of one of said cells in said second array, then said output circuitry reads out data which is at least partially determined by the contents of said second array.

2. The integrated circuit memory of claim 1, wherein said first and second arrays of memory cells comprise EEPROM memories.

3. The integrated circuit memory of claim 1, wherein data is written simultaneously to said first and said second arrays of memory cells, and if no error has occurred, said data is erased from said second array of memory cells.

4. The integrated circuit memory of claim 1, wherein data is written to said second array of memory cells only if an error has occurred in writing to said first array of memory cells.

5. The integrated circuit memory of claim 1, wherein writing to said second array of memory cells can occur simultaneously with writing to said first array of memory cells.

6. An integrated circuit memory, comprising:
   a first array of floating-gate memory cells arranged in rows and columns, wherein each individual one of said cells consists only of a single transistor, and stores more than one bit of data;
   a second array of memory cells storing data which includes multiple address-match identifiers, said second array being less than half the size of said first array; and wherein said second array, but not said first array, is content-addressable;
   and circuitry which provides an output, when access to a read address is requested, as follows:
     if read access is requested to an address which is not stored in the address-match field of any cell in said second array, then said circuitry reads out data from said first array with multiple bits of precision, without any read access to said second array; and
     if read access is requested to an address which matches the address-match field of one of said cells in said second array, then said output circuitry reads out data which is at least partially determined by the contents of said second array.

7. The integrated circuit memory of claim 6, wherein said first and second arrays of memory cells comprise EEPROM memories.

8. The integrated circuit memory of claim 6, wherein data is written simultaneously to said first and said second arrays of memory cells, and if no error has occurred, said data is erased from said second array of memory cells.

9. The integrated circuit memory of claim 6, wherein data is written to said second array of memory cells only if an error has occurred in writing to said first array of memory cells.

10. The integrated circuit memory of claim 6, wherein writing to said second array of memory cells can occur simultaneously with writing to said first array of memory cells.

11. An integrated circuit memory, comprising:
   a first array of memory cells;
   a second array of memory cells storing data which includes multiple address-match identifiers, said second array being content addressable and less than half the size of said first array;
   and circuitry which provides an output, when access to a read address is requested, as follows:
     if the read address does not match any of said address-match identifiers in said second array, then said circuitry reads out data from said first array with multiple bits of precision from each cell, and does not output data from said second array; and
     if the read address does not match any of said address-match identifiers in said second array, then said circuitry outputs data which is at least partially determined by the contents of said second array.

12. The integrated circuit memory of claim 11, wherein said first and second arrays of memory cells comprise EEPROM memories.

13. The integrated circuit memory of claim 11, wherein data is written simultaneously to said first and said second arrays of memory cells, and if no error has occurred, said data is erased from said second array of memory cells.

14. The integrated circuit memory of claim 11, wherein data is written to said second array of memory cells only if an error has occurred in writing to said first array of memory cells.

15. The integrated circuit memory of claim 11, wherein writing to said second array of memory cells can occur simultaneously with writing to said first array of memory cells.

16. A multilevel memory device with an error check and correction function and having a data input, a data output, and an address input, said memory device comprising:

(a.) first memory means designed to be accessed by means of an address, for containing user data, (b.) second memory means for containing error data concerning said user data, (c.) a control logic designed to receive in the writing phase from said address input and said data input a writing address and user data respectively to generate error data and to write said user data and error data in said first and second means respectively, and designed to receive in the reading phase from said address input a reading address and to extract corresponding user data and error data and to combine said user data and error data for correction of any errors, and to supply corrected data to said data output, and wherein said second means are the type designed to be accessed by means of content and said content for access corresponds to addresses of said first means.

17. The device according to claim 16, wherein said control logic comprises check means designed to generate in the writing phase a check signal corresponding to the comparison between said user data and the data written in said first means and in which said check signal enables the writing of said second means if an error occurs in writing said user data in said first means.

18. The device according to claim 17, wherein said check signal enables furthermore the generation of said error data in the writing phase.

19. The device according to claim 16, wherein said control logic comprises check means designed to generate in the writing phase a check signal corresponding to the comparison between said user data and the data written in said first means and in which said check signal enables erasure from said second means of said error data if no error occurs in the writing of said user data in said first means.

20. The device according to claim 16, wherein said error data correspond to said user data.

21. The device according to claim 16, comprising furthermore a coder designed to generate said error data in such a manner that the error data correspond to the coding of said user data by means of an algorithm capable of identifying and correcting a predetermined number of errors.

22. The device according to claim 16, comprising furthermore a coder designed to generate said error data in such a manner that the error data correspond to the coding of the difference between said user data and the data written in said first means.

23. The device according to claim 16, wherein said first means are the multilevel type and said second means are the two-level type.

24. The device according to claim 16, wherein said first and second means consist of two semiconductor memory cell matrices and specifically the EEPROM or flash EPROM type.

25. A method of reading corrected user data from a memory device of the type comprising first memory means for containing user data designed to be accessed by means of address and second memory means for containing error data concerning said user data designed to be accessed by means of content and comprising the following phases:

(a.) send to said device a reading address corresponding to the user data to be read, (b.) access said first memory means to read user data stored with multiple bits of precision in said first memory means, (c.) access said second memory means to read any error data in said second memory means, and (d.) combine said addressed user data and any error data to obtain said corrected user data.

26. A reading method in accordance with claim 25 in which if there are no error data corresponding to said reading address, said corrected data correspond to said addressed data and said phase d) has no effect.

27. A method for writing corrected user data in a memory device of the type comprising first memory means for containing user data designed to be accessed by means of address and second memory means for containing error data concerning said user data designed to be accessed by means of content and comprising the following phases:

(a.) send to said device a writing address, (b.) send to said device user data to be memorized, (c.) write the user data to be memorized in said first memory means in a position corresponding to said writing address, (d.) access by means of said writing address to user data addressed in said first memory means, (e.) check the identity of said user data to be memorized and of said addressed user data and in case of failure of said check:

(f.) generate error data capable of correcting errors in the addressed user data, and (g.) write said error data generated in said second memory means and associate the error data with access to said writing address.

28. The writing method in accordance with claim 27 in which if said generated error data correspond to said user data to be memorized, said phases f) and g) have no effect.

29. The writing method in accordance with claim 27 in which in case of non-failure of said check, there are erased from said second means any error data associated with said writing address.

30. A method of writing corrected user data in a memory device of the type comprising first memory means for containing user data designed to be accessed by means of address and second memory means for containing error data concerning said user data and comprising the following phases:

(a.) send to said device a writing address, (b.) send to said device user data to be memorized, (c.) write said user data to be memorized in said first means in a position corresponding to said writing address, (d.) access by means of said writing address to user data addressed in said first means, (e.) generate error data capable of correcting errors in said addressed user data, (f.) write said error data in said second means and associate the error data with said writing address for access, (g.) check the identity of said user data to be memorized and of said addressed user data, and (h.) if the check is successful erase from said second means the error data associated with said writing address.

31. A method of erasing user data in a memory device of the type comprising first memory means for containing user data designed to be accessed by means of address and second memory means for containing error data concerning said user data designed to be accessed by means of content and comprising the following phases:

(a.) send to said device an erasure address, (b.) erase from said first means user data in a position corresponding to the erasure address, and (c.) erase from said second means any associated error data for access to said erasure address.

* * * * *

UNITED STATES PATENT AND TRADEMARK OFFICE
CERTIFICATE OF CORRECTION

PATENT NO. : 5,761,222
DATED : 6/2/98
INVENTOR(S) : Livio Baldi

It is certified that error appears in the above-indentified patent and that said Letters Patent is hereby corrected as shown below:

Column 10, Line 47     strike "not"

Signed and Sealed this

Twenty-seventh Day of March, 2001

Attest:

NICHOLAS P. GODICI

Attesting Officer     *Acting Director of the United States Patent and Trademark Office*